US009110103B2

(12) United States Patent
Tillotson (10) Patent No.: US 9,110,103 B2
(45) Date of Patent: *Aug. 18, 2015

(54) TEMPERATURE COMPENSATED PROXIMITY SENSOR

(71) Applicant: HONEYWELL INTERNATIONAL INC., Morristown, NJ (US)

(72) Inventor: John Kenneth Tillotson, Petoskey, MI (US)

(73) Assignee: HONEYWELL INTERNATIONAL INC., Morristown, NJ (US)

( * ) Notice: Subject to any disclaimer, the term of this patent is extended or adjusted under 35 U.S.C. 154(b) by 163 days.

This patent is subject to a terminal disclaimer.

(21) Appl. No.: 13/770,285

(22) Filed: Feb. 19, 2013

(65) Prior Publication Data

US 2013/0193985 A1    Aug. 1, 2013

Related U.S. Application Data (60) Continuation-in-part of application No. 13/686,437, filed on Nov. 27, 2012, and a division of application No. 12/786,046, filed on May 24, 2010, now Pat. No. 8,319,500.

(51) Int. Cl.
*G01R 27/28* (2006.01)
*G01R 31/08* (2006.01)
(Continued)

(52) U.S. Cl.
CPC .............. *G01R 1/44* (2013.01); *H03K 17/9502* (2013.01); *H03K 17/9525* (2013.01); *H03K 17/9547* (2013.01)

(58) Field of Classification Search
CPC ............ H03K 17/952; H03K 17/9525; H03K 17/945; H03K 17/96; G01R 27/28; G01R 1/44
USPC .......................... 324/616, 207.15, 207.26, 522
See application file for complete search history.

(56) References Cited

U.S. PATENT DOCUMENTS 3,870,948 A    3/1975 Holt et al.
4,543,527 A *  9/1985 Schuchmann et al. ... 324/207.26
(Continued)

FOREIGN PATENT DOCUMENTS

FR    2281578 A1    3/1976
WO    0209284       1/2002

OTHER PUBLICATIONS

EP Search Report for Application No. EP 11165765.6 dated Aug. 5, 2014.
(Continued)

*Primary Examiner* — Amy He
(74) *Attorney, Agent, or Firm* — Ingrassia Fisher & Lorenz, P.C.

(57) ABSTRACT

A proximity sensor includes a relatively simple temperature compensation circuit, and includes a variable gain oscillator, a temperature sensor circuit, and a proximity determination circuit. The variable gain oscillator has a gain that varies with the proximity of a target to a sensor coil, generates an oscillating electrical signal having a substantially constant amplitude magnitude, and generates an energy signal representative of the electrical energy needed to sustain oscillations. The temperature compensation circuit senses proximity sensor temperature and supplies a temperature signal representative thereof, and the proximity determination circuit, based on the energy signal, supplies a proximity signal representative of target proximity to the sensor coil. The proximity determination circuit includes a comparator and a fixed resistor network. The comparator circuit supplies the proximity signal. The fixed resistor network is coupled between the temperature sensor circuit and comparator circuit and supplies a temperature compensation signal to the comparator circuit.

20 Claims, 2 Drawing Sheets (51) Int. Cl.
*G01R 1/44* (2006.01)
*H03K 17/95* (2006.01)

(56) References Cited

U.S. PATENT DOCUMENTS

| | | |
|---|---|---|
| 5,043,679 A | 8/1991 | Kriz et al. |
| 7,924,103 B2 * | 4/2011 | Kuehn ............................ 331/65 |
| 2010/0033197 A1 | 2/2010 | Niwa |

OTHER PUBLICATIONS

EP Examination Report for Application No. EP 11165765.6 dated Aug. 19, 2014.
USPTO Office Action, Notification date Sep. 29, 2014; U.S. Appl. No. 13/686,437.
EP Examination Report for Application No. 11165765.6 dated Mar. 9, 2015.
USPTO Final Office Action, Notification date Jan. 23, 2015; U.S. Appl. No. 13/686,437.

* cited by examiner

TEMPERATURE COMPENSATED PROXIMITY SENSOR

CROSS-REFERENCES TO RELATED APPLICATIONS

This application is a continuation-in-part (CIP) of application Ser. No. 13/686,437, filed Nov. 27, 2012, which is a divisional of application Ser. No. 12/786,046 filed May 24, 2010, now U.S. Pat. No. 8,319,500.

TECHNICAL FIELD

The present invention generally relates to proximity sensors, and more particularly relates to a proximity sensor that implements a relatively simple temperature compensation scheme.

BACKGROUND

Proximity sensors have long been used to sense when a device or component is within a predetermined distance of (i.e., in proximity to) a reference location. In many instances, the signals generated by a proximity sensor may be used to selectively enable and disable various portions of a system. For example, if a proximity sensor senses that a device or component is within a predetermined distance of a reference location, this may indicate an undesired configuration. In such an instance, the proximity sensor output signal may be used to disable a system (or portion thereof). Conversely, if a device or component being within a predetermined distance of a reference location is a desired configuration, the proximity sensor output signal may be used to enable a system (or portion thereof).

Proximity sensors have been implemented using various configurations. One particular configuration is generally referred to as the eddy current kill oscillator (ECKO) configuration. With this configuration, the amplitude of a fixed gain oscillator is reduced or eliminated when a device or component is within a predetermined distance of the proximity sensor. The oscillator amplitude is compared to a threshold value, which supplies a binary signal based on this comparison.

One drawback of ECKO proximity sensors is that faulty or erroneous circuit operation can cause false proximity indications. To address this drawback, high-reliability systems may include multiple ECKO proximity sensors so that a faulty or erroneously operating circuit may be detected. This, however, can increase overall system weight and cost. Moreover, adding internal diagnostic circuitry to a proximity sensor can be difficult and costly.

Another drawback of ECKO proximity sensors, as well as other types of proximity sensors, is that sensor accuracy can be impacted by temperature. To date, relatively complex temperature compensation schemes have been employed to alleviate such temperature effects. This can lead to increased sensor cost.

Hence, there is a need for a proximity sensor that includes diagnostic circuitry that may be implemented relatively simply and inexpensively and/or includes temperature compensation circuitry that may be implemented relatively simply and inexpensively. The present invention addresses at least these needs.

BRIEF SUMMARY

In one embodiment, and by way of example only, a proximity sensor includes a variable gain oscillator, a temperature sensor circuit, and a proximity determination circuit. The variable gain oscillator is adapted to receive electrical energy. The variable gain oscillator includes a sensor coil and has a gain that varies with proximity of a target to the sensor coil. The variable gain oscillator is coupled to receive a feedback signal and is configured, in response to the feedback signal, to generate an oscillating electrical signal having a substantially constant amplitude magnitude, and generate an energy signal representative of the electrical energy received by the variable gain oscillator. The temperature sensor circuit is configured to sense proximity sensor temperature and supply a temperature signal representative thereof. The proximity determination circuit is coupled to receive the energy signal and is configured, in response thereto, to supply a proximity signal representative of target proximity to the sensor coil. The proximity determination circuit includes a near/far comparator circuit and a fixed resistor network. The near/far comparator is coupled to receive the energy signal and is configured, in response thereto, to supply the proximity signal at a logic-LOW state when the target is within a first predetermined distance of the sensor coil, and at a logic-HIGH state at least when the target is not within a second predetermined distance of the sensor coil. The fixed resistor network is coupled between the temperature sensor circuit and the near/far comparator and is configured to supply a temperature compensation signal to the near/far comparator circuit.

In another embodiment, a proximity sensor includes a variable gain oscillator, a feedback circuit, a health monitor circuit, and a proximity determination circuit. The variable gain oscillator is adapted to receive electrical energy. The variable gain oscillator includes a sensor coil and has a gain that varies with proximity of a target to the sensor coil. The variable gain oscillator is coupled to receive a feedback signal and is configured, in response to the feedback signal, to generate an oscillating electrical signal having a substantially constant amplitude magnitude, and generate an energy signal representative of the electrical energy received by the variable gain oscillator. The feedback circuit is coupled to receive the oscillating electrical signal and configured, in response thereto, to supply the feedback signal. The health monitor circuit is coupled to receive the oscillating electrical signal and is configured, in response thereto, to supply a health status signal representative of proximity sensor health. The proximity determination circuit is coupled to receive the energy signal and is configured, in response thereto, to supply a proximity signal representative of target proximity to the sensor coil. The proximity determination circuit includes a low-pass filter circuit, a near/far comparator circuit, and a fixed resistor network. The low-pass filter circuit is coupled to receive the energy signal and supply a filtered energy signal. The near/far comparator circuit is coupled to receive the filtered energy signal and is configured, in response thereto, to supply the proximity signal at a logic-LOW state when the target is within a first predetermined distance of the sensor coil, and at a logic-HIGH state at least when the target is not within a second predetermined distance of the sensor coil. The fixed resistor network is coupled to the near/far comparator and is adapted to receive a temperature signal. The fixed resistor network is configured, in response to the temperature signal, to supply a temperature compensation signal to the near/far comparator circuit.

In yet another embodiment, a proximity sensor includes a variable gain oscillator, a temperature sensor circuit, and a proximity sensor. The variable gain oscillator is adapted to receive electrical energy. The variable gain oscillator includes a sensor coil and has a gain that varies with proximity of a target to the sensor coil. The variable gain oscillator is coupled to receive a feedback signal and is configured, in response to the feedback signal, to generate an oscillating electrical signal having a substantially constant amplitude magnitude, and generate an energy signal representative of the electrical energy received by the variable gain oscillator. The temperature sensor circuit is configured to sense proximity sensor temperature and supply a temperature signal representative thereof. The temperature sensor circuit includes a temperature sensitive resistive element. The proximity determination circuit is coupled to receive the energy signal and is configured, in response thereto, to supply a proximity signal representative of target proximity to the sensor coil. The proximity determination circuit includes a low-pass filter circuit, a near/far comparator circuit, and a fixed resistor network. The low-pass filter circuit is coupled to receive the energy signal and supply a filtered energy signal. The near/far comparator circuit is coupled to receive the filtered energy signal and is configured, in response thereto, to supply the proximity signal at a logic-LOW state when the target is within a first predetermined distance of the sensor coil, and at a logic-HIGH state at least when the target is not within a second predetermined distance of the sensor coil. The near/far comparator circuit includes a first voltage divider network that includes a first resistor and a second resistor connected in series to define a threshold node therebetween. The fixed resistor network is coupled between the temperature sensor circuit and the near/far comparator and is configured to supply a temperature compensation signal to the near/far comparator circuit. The fixed resistor network includes at least one resistor and a temperature compensation node. The temperature compensation node is coupled to the temperature sensitive resistive element and the threshold node.

Furthermore, other desirable features and characteristics of the proximity sensor will become apparent from the subsequent detailed description and appended claims, taken in conjunction with the accompanying drawings and the preceding background.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any theory presented in the preceding background or the following detailed description.

Figure 1:
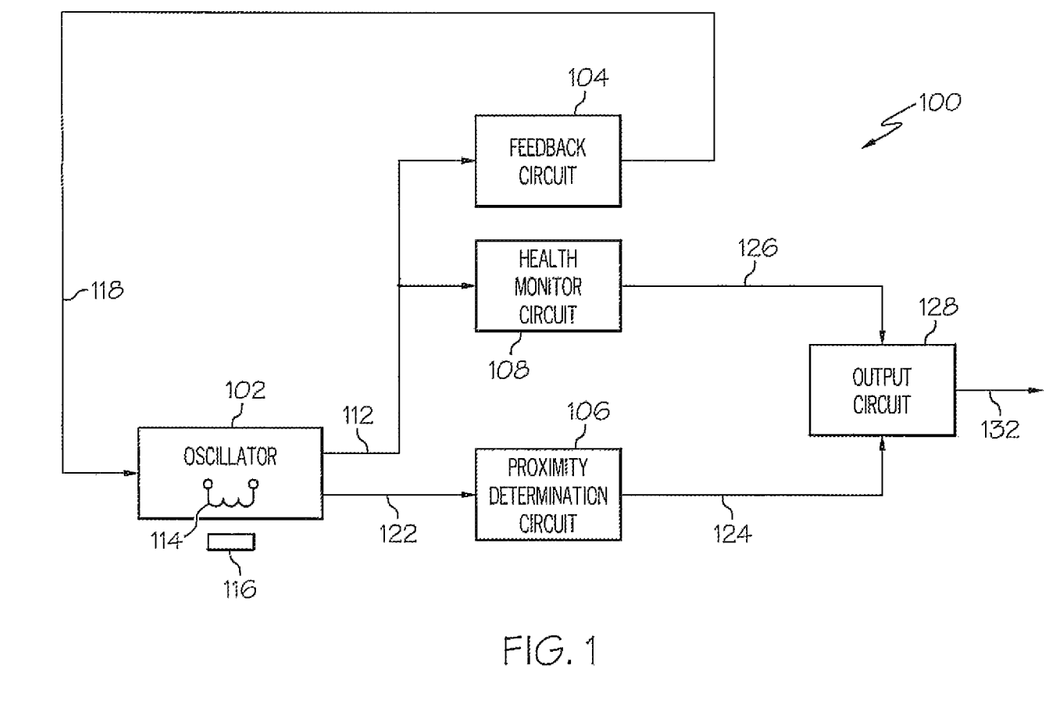
FIG. 1 depicts a functional block diagram an embodiment of a proximity sensor according to the present invention.

Referring first to FIG. 1, a functional block diagram of an embodiment of a proximity sensor 100 is depicted. The depicted proximity sensor 100 includes a variable gain oscillator 102, a feedback circuit 104, a proximity determination circuit 106, and a health monitor circuit 108. The variable gain oscillator 102 is configured, upon being supplied with electrical energy, to generate an oscillating electrical signal 112. The frequency of the oscillating electrical signal 112 is established by the components that comprise a non-illustrated resonant circuit. In the depicted embodiment, a sensor coil 114 comprises at least one of these components. The variable gain oscillator 102 is additionally configured such that its gain varies with the proximity of a target 116 to the sensor coil 114. In particular, as FIG. 1 additionally depicts, the variable gain oscillator 102 is coupled to receive a feedback signal 118. The feedback signal 118 causes the gain of the variable gain oscillator 102 to vary in a manner that the oscillating electrical signal 112 has a substantially constant amplitude magnitude. Without the feedback signal, the amplitude magnitude of the oscillating signal would vary with the proximity variations of the target 116 to the sensor coil 114.

The feedback signal 118 is supplied to the variable gain oscillator 102 by the feedback circuit 104. In particular, the feedback circuit 104 is coupled to receive the oscillating electrical signal 112 from the variable gain oscillator 102 and is configured, in response thereto, to supply the feedback signal 118. The specific manner in which the feedback circuit 104 generates the feedback signal 118 will be described in more detail further below.

In addition to generating the oscillating electrical signal 112, the variable gain oscillator 102 supplies an energy signal 122. The energy signal 122, which is supplied to the proximity determination circuit 106, is representative of the electrical energy received by the variable gain oscillator 102. The proximity determination circuit 106 is configured, in response to the energy signal 122, to supply a proximity signal 124 representative of the proximity of the target 116 to the sensor coil 114.

The health monitor circuit 108 is also coupled to receive the oscillating electrical signal 112 from the variable gain oscillator 102. The health monitor circuit 108, in response to the oscillating electrical signal 112, supplies a health status signal 126 that is representative of proximity sensor health.

In the depicted embodiment, the health status signal 126 and the proximity signal 124 are both supplied to an output circuit 128. The output circuit 128 is configured, upon receipt of these two signals 124, 126, to supply a sensor output signal 132. The sensor output signal 132 is representative of both target proximity and proximity sensor health.

Each of the above-described circuit blocks that comprise the proximity sensor 100 may be implemented using any one of numerous circuit configurations. A schematic diagram of a particular preferred implementation of the proximity sensor 100, illustrating specific circuit configurations of each of the functional circuit blocks described above, is depicted in FIG. 2, and with reference thereto will now be described.

Figure 2:
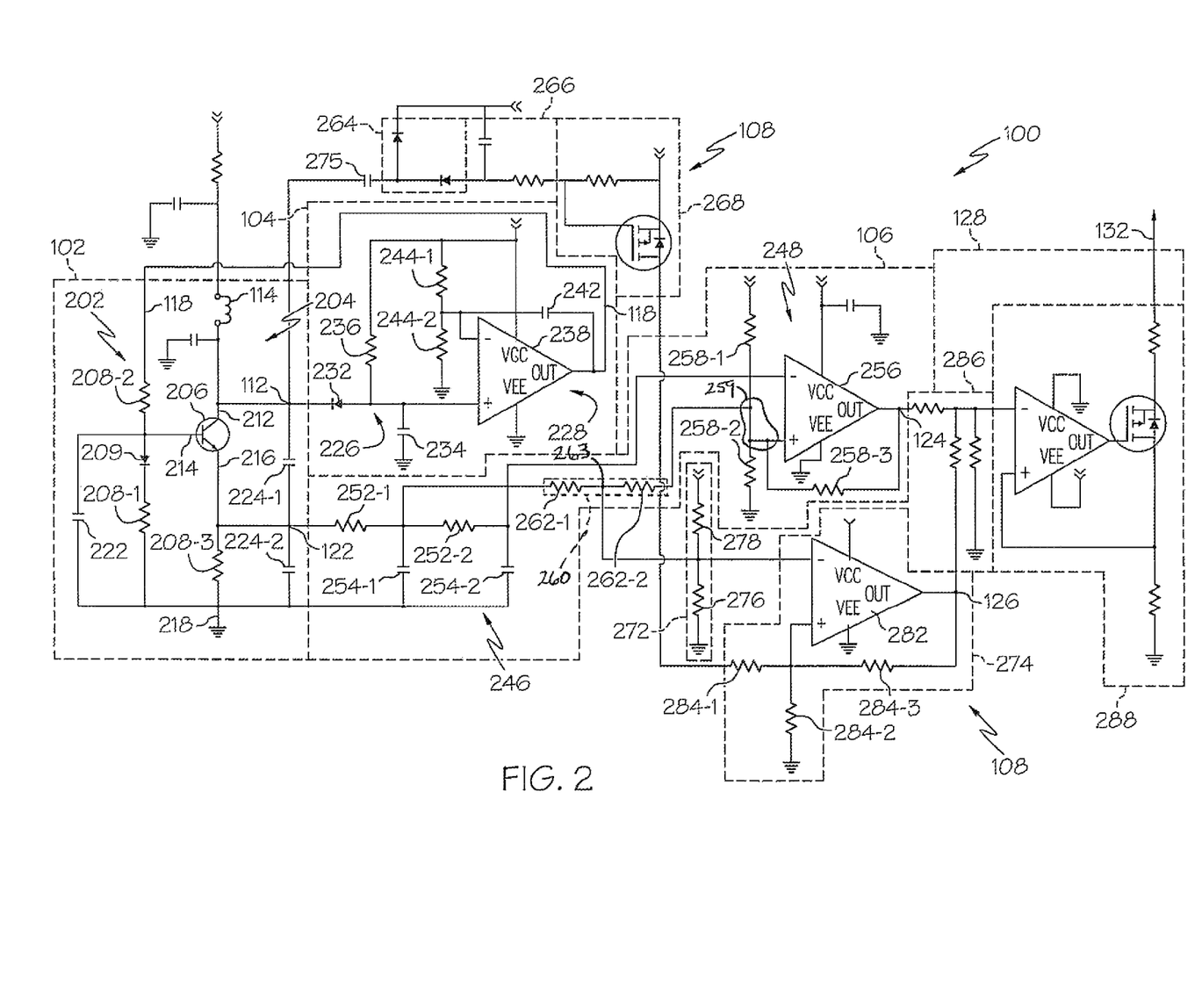
FIG. 2 depicts a schematic circuit diagram of a particular circuit that may be used to implement the proximity sensor of FIG. 1.

Beginning with the variable gain oscillator 102, it is seen that this circuit is implemented using the well-known Colpitts oscillator circuit configuration, and includes a transistor circuit 202 and a resonant tank circuit 204. The transistor circuit 202 includes a transistor 206, a plurality of bias resistors 208 (208-1, 208-2, 208-3), and a diode 209. The transistor 206 is implemented using an NPN-type bipolar transistor, which, as is generally known, includes a collector terminal 212, a base terminal 214, and an emitter terminal 216. It will be appreciated that the transistor circuit 202 could alternatively be implemented using a PNP-type bipolar transistor or using other kinds of transistors.

The bias resistors 208 are selected to limit current consumption in the event the target 116 is much closer to the sensor coil 114 than a nominal sensing distance. The bias resistors 208 are sized to limit the available base drive to the transistor 206 upon the integrator 228 (discussed below) reaching the most positive supply voltage. This reduces power consumption. The diode 209 compensates for variations in the emitter-base voltage of the transistor 206. This allows the current limiting feature to work over temperature.

Two of the bias resistors 208-1, 208-2 are connected to the transistor base terminal 214, and are thus referred to herein as base resistors 208-1, 208-2. The third bias resistor 208-3 is connected the transistor emitter terminal 216, and is thus referred to herein as the emitter resistor 208-3. One of the base resistors 208-1 is connected between the transistor base terminal 214 and a circuit reference node 218. A bypass capacitor 222 is connected in parallel with this base resistor 208-1 and keeps the transistor base terminal 214 at a fixed value. The other base resistor 208-2 is connected to receive the feedback signal 118. As described above, the feedback signal 118 varies the gain of the transistor circuit 202 to counteract the effects that the proximity variations of the target 116 (not shown in FIG. 2) to the sensor coil 114 have on the amplitude magnitude of the oscillating electrical signal 112.

As may be appreciated, variations in the gain of the transistor circuit 202 result in variations of the electrical energy that the variable gain oscillator 102 needs to sustain its oscillations. In the depicted embodiment, the variations in electrical energy supplied to the variable gain oscillator 102 are measured using the emitter resistor 208-3. In particular, as the gain of the transistor circuit 202 varies, the amount of electrical energy that the variable gain oscillator 102 needs to sustain its oscillations varies, resulting in variations of the magnitude of the current flowing through the emitter resistor 208-3. Hence, the magnitude of the voltage drop across the emitter resistor 208-3 is representative of the electrical energy being supplied to the variable gain oscillator 102, and these variations constitute the energy signal 122 that is supplied to the proximity determination circuit 106.

The resonant tank circuit 204 includes the sensor coil 114 and two capacitors 224 (224-1, 224-2) that comprise a capacitive voltage divider. As is generally known, the frequency of the oscillating electrical signal 112 is established by the component values of the sensor coil 114 and the capacitors 224. In the depicted embodiment, one of the capacitors 224-1 has one of its terminal connected to the sensor coil 114 and to the transistor collector terminal 212, and its other terminal connected to the transistor emitter terminal 216. This capacitor 224-1 is the main tuning capacitor of the resonant tank circuit 204. The other capacitor 224-2, which connected between the transistor emitter terminal 216 and circuit reference node 218, sustains the oscillations of the resonant tank circuit 204.

The feedback circuit 104, as noted above, is coupled to receive the oscillating electrical signal 112 from the variable gain oscillator 102 and is configured, in response thereto, to supply the feedback signal 118. To implement this functionality, the feedback circuit includes an amplitude demodulator 226 and an integrator circuit 228. The amplitude demodulator 226, which includes a diode 232, a capacitor 234, and a resistor 236, receives the oscillating electrical signal 112 from the variable gain oscillator 102 and, in response, supplies a demodulated voltage signal to the integrator circuit 228. More specifically, the amplitude demodulator 226 measures the negative peaks of the oscillating electrical signal 112.

The integrator circuit 228 is coupled to receive the demodulated voltage signal from the demodulator circuit 226. The integrator circuit 228 is configured, in response to the demodulated voltage signal, to supply the feedback signal 118. In the depicted embodiment, the integrator circuit 228 includes an operational amplifier 238, a feedback capacitor 242, and two resistors 244 (244-1, 244-2) that establish a reference voltage. With this configuration, if the amplitude magnitude of the oscillating electrical signal 112 begins to decrease due, for example, to the target 116 moving into proximity to the sensor coil 114, then the demodulated voltage on capacitor 234 will increase. When this voltage increases above the reference voltage established by the resistors 244, the output of the integrator circuit 228, and thus the feedback signal 118, will increase in the positive direction. The feedback signal 118 will thus increase the bias on the transistor 206, which increases its gain and corrects the amplitude magnitude decrease. When the desired amplitude magnitude is attained, the output of the integrator circuit 228 stops increasing. Conversely, if the amplitude magnitude of the oscillating electrical signal 112 begins to increase due, for example, to the target 116 moving away from the sensor coil 114, then the demodulated voltage on capacitor 234 will decrease. When this voltage decreases below the reference voltage established by the resistors 244, the output of the integrator circuit 228, and thus the feedback signal 118, will decrease in the negative direction. The feedback signal 118 will thus decrease the bias on the transistor 206, which decreases its gain and corrects the amplitude magnitude increase. When the desired amplitude magnitude is attained, the output of the integrator circuit 228 stops decreasing.

The proximity determination circuit 106 is coupled to receive the energy signal 122. Because the electrical energy being supplied to the variable gain oscillator 102 varies with target 116 proximity to the sensor coil 114, the energy signal 122 may be used to determine target 116 proximity to the sensor coil 114. In the depicted embodiment, the proximity determination circuit 106 includes a low-pass filter circuit 246 and a near/far comparator circuit 248. The low-pass filter circuit 246 is connected to the emitter resistor 208-3, and thus receives the energy signal 122. The low-pass filter circuit 246, which comprises two resistors 252 (252-1, 252-2) and two capacitors 254 (254-1, 254-2) connected as a two-pole low-pass filter, filters the energy signal 122 and supplies the filtered energy signal to the near/far comparator circuit 248.

The near/far comparator circuit 248 receives the filtered energy signal from the low-pass filter circuit 246 and, in response to this signal, supplies the proximity signal 124. In the depicted embodiment, the near/far comparator circuit 248 is configured such that the proximity signal 124 is supplied at two different amplitude magnitudes, depending on the relative proximity of the target 116 to the sensor coil 114. To implement this functionality the near/far comparator circuit 248 includes an operational amplifier 256 and a plurality of resistors 258 (258-1, 258-2, 258-3). The inverting input of the operational amplifier 256 is connected to the low-pass filter circuit 246 and thus receives the filtered energy signal therefrom. The non-inverting input of the operational amplifier 256 is connected to receive a reference voltage that is established by two of the resistors 258-1, 258-2. These two resistors 258-1, 258-2 are connected in series to define a threshold node 259. The voltage at the threshold node 259 establishes the threshold between the target "near" and target "far" determinations (discussed below). The third resistor 258-3, which is a feedback resistor that is connected between the output and the non-inverting input of the operational amplifier 256, establishes hysteresis for the near/far comparator circuit 248.

From the above description it may thus be appreciated that the proximity signal 124 is a binary signal. That is, the near/far comparator circuit 248 supplies the proximity signal 124 at a first amplitude magnitude when the target 116 is within a first predetermined distance of the sensor coil 114 (e.g., the target 116 is relatively "near" to the sensor coil 114), and at a second amplitude magnitude at least when the target 116 is not within a second predetermined distance of the sensor coil 114 (e.g., the target 116 is relatively "far" from the sensor coil 114). In the depicted embodiment, the first amplitude magnitude is a relatively high value (e.g., logic-HIGH state) when the target 116 is far from the sensor coil 114, and is a relatively low value (e.g., logic-LOW state) when the target 116 is near to the sensor coil 114.

Before describing the depicted health monitor circuit 108 in more detail, it is seen that the depicted proximity sensor 100 additionally includes a fixed resistor network 260, which provides temperature compensation for the proximity determination circuit 106. The fixed resistor circuit 260 is coupled between a temperature sensor circuit 272 (described further below) and the near/far comparator circuit 248. More specifically, at least in the depicted embodiment, the fixed resistor circuit 260 is connected between the low-pass filter circuit 246 and the non-inverting input of the operational amplifier 256, and supplies a temperature compensation signal to the near/far comparator 248.

In the depicted embodiment, the fixed-resistor circuit 260 is implemented using two resistors 262—a first resistor 262-1 and a second resistor 262-2—connected in series to define a temperature compensation node 263. It will be appreciated, however, that in other embodiments, the fixed resistor circuit 260 could be implemented with only one of the resistors 262-1 or 262-2. Whether the fixed-resistor circuit 260 includes one or both of the resistors 262-1, 262-2, the temperature compensation node 263 is connected to the threshold node 259, and the temperature compensation signal is supplied to the threshold node 259 via this connection. The temperature sensor circuit 272 is coupled to the temperature compensation node 263, and supplies a temperature signal representative of proximity sensor temperature to this node 263. Thus, the temperature compensation signal varies in response to variations of temperature signal (e.g., proximity sensor temperature), which in turn causes the voltage at the threshold node 259 to vary. As was previously noted, the voltage at the threshold node 259 establishes the threshold between the target "near" and target "far" determinations. As a result, this threshold varies in response to, and is thus compensated for, proximity sensor temperature variations.

Those skilled in the art will appreciate that variations of sensor packages may result in a variety of sensing distance errors induced by temperature variation. This resistive circuit configuration provides relatively simple compensation of a wide range of temperature errors, permitting the basic design to be reused for other similar applications. If sensing distance increases with temperature, resistor 262-2 is used to provide correction. Conversely, if sensing distance decreases with temperature, then resistor 262-1 is used. The degree of compensation is tailored by the resistor value (262-1 and/or 262-2) and does not require a different value thermistor 276 (discussed below).

Turning now to a description of the health monitor circuit 108, this circuit includes a rectifier circuit 264, a low-pass filter circuit 266, an alive/dead switch circuit 268, a temperature sensor circuit 272, and a health comparator circuit 274. The rectifier circuit 264 is coupled to receive the oscillating electrical signal 112 from the variable gain oscillator 102, preferably via a blocking capacitor 275. The rectifier circuit 264 rectifies the oscillating electrical signal 112 and supplies a DC signal to the low-pass filter circuit 266. The low-pass filter circuit 266 filters the DC signal and supplies a filtered DC signal to the alive/dead switch circuit 268. As may be appreciated, the voltage magnitude of the filtered DC signal will vary with the amplitude magnitude of the oscillating electrical signal 112.

The alive/dead switch circuit 268 is coupled to receive the filtered DC signal and, in response to the filtered DC signal, supplies an oscillator health signal. The alive/dead switch circuit 268 is configured to be in either a conductive (ON) state or a nonconductive (OFF) state, based on the voltage magnitude of the filtered DC signal. In particular, when the variable gain oscillator 102 is operating properly, the amplitude magnitude of the oscillating electrical signal 112, and concomitantly the voltage magnitude of the filtered DC signal, will have a value that causes the alive/dead switch circuit 268 to be in its conductive (ON) state. Conversely, if the variable gain oscillator 102 is not operating properly (or not operating at all), the amplitude magnitude of the oscillating electrical signal 112, and concomitantly the voltage magnitude of the filtered DC signal, will have a value that causes the alive/dead switch circuit 268 to be in its non-conductive (OFF) state. It may thus be appreciated that the oscillator health signal is a binary signal. That is, the amplitude magnitude of the oscillator health signal will have a relatively high value (e.g., logic-HIGH state) when the variable gain oscillator 102 is operating properly, and a relatively low value (e.g., logic-LOW state) when the variable gain oscillator 102 is not operating properly (or not operating at all). In the depicted embodiment the alive/dead switch circuit 268 is implemented using a MOSFET. It will be appreciated, however, that various other types of transistors, or various other devices or circuits that selectively transition between conductive and non-conductive states, may also be used.

The temperature sensor circuit 272 is configured to sense the temperature of the proximity sensor 100 and supply a temperature signal representative of the sensed temperature. The temperature sensor circuit 272 includes a thermistor 276 and a resistor 278 connected in series to form a voltage divider. The thermistor 276, at least in the depicted embodiment, is implemented using a positive temperature coefficient thermistor. In alternative embodiments, however, a negative temperature coefficient thermistor could be used. In either case, the voltage drop across the thermistor 276, and thus the temperature signal, varies with the temperature of the proximity sensor 100. As was noted above, the temperature sensor circuit 272 is coupled to the temperature compensation node 263, and supplies the temperature signal representative of proximity sensor temperature to this node 263.

The health comparator circuit 274 is coupled to receive the temperature signal from the temperature sensor circuit 272 and the oscillator health signal from the alive/dead switch circuit 268. The health comparator circuit 274 is configured, upon receipt of the temperature signal and the oscillator health signal, to supply the health status signal 126 to the output circuit 128. The health comparator circuit 274 includes an operational amplifier 282 and a plurality of resistors 284 (284-1, 284-2, 284-3). The inverting input of the operational amplifier 282 is connected to the temperature sensor circuit 272 and thus receives the temperature signal therefrom. The non-inverting input of the operational amplifier 282 is coupled to receive the oscillator health signal from the alive/dead switch circuit 268, via two of the resistors 284-1, 284-2. The third resistor 284-3, which is a feedback resistor that is connected between the output and the non-inverting input of the operational amplifier 282, establishes hysteresis for the health comparator circuit 274. It may thus be appreciated that the health status signal 126 is a binary signal. That is, the health comparator circuit 274 supplies the health status signal 126 at a relatively high amplitude magnitude (e.g., logic-HIGH state) when the oscillator health signal is at a logic-HIGH state and the temperature of the proximity sensor 100 is at or below a first predetermined temperature, and at a relatively low amplitude magnitude (e.g., logic-LOW state) when the oscillator health signal is at a logic-LOW state or the temperature of the proximity sensor 100 is at or above a second predetermined temperature that is higher than the first predetermined temperature. It will be appreciated that the first and second predetermined temperatures may vary.

The output circuit 128 includes a summing circuit 286 and a voltage-to-current converter circuit 288. The summing circuit 286, which in the depicted embodiment is implemented as a summing node, is coupled to receive the proximity signal 124 from the near/far comparator circuit 248, and the health status signal 126 from the health comparator circuit 274. The summing circuit 286, upon receipt of proximity signal 124 and the health status signal 126, supplies a summation signal that is representative of the arithmetic sum of these signals. From the descriptions of the previous circuits, it may be readily understood that the summation signal, at least in the depicted embodiment, will preferably have substantially discrete voltage magnitude values. In particular, when the health status signal 126 is at a logic-HIGH state, the summation signal will have a first voltage magnitude if the proximity signal 124 is at a logic-LOW state and have a second, higher voltage magnitude if the proximity signal is at a logic-HIGH state. If, however, the health status signal 126 is at a logic-LOW state, then the summation signal will have a third voltage magnitude that is less than the first voltage magnitude if the proximity signal 124 is at a logic-LOW state and have a fourth voltage magnitude that is intermediate the first and second voltage magnitudes if the proximity signal 124 is at a logic-HIGH state.

The summation signal is supplied to the voltage-to-current converter circuit 288. The voltage-to-current converter circuit 288, upon receipt of the summation signal, supplies the sensor output signal 132. The voltage-to-current converter circuit 288 is configured such that the current magnitude of the sensor output signal 132 varies based on the voltage magnitude of the summation signal. In the depicted embodiment, the voltage-to-current converter circuit 288 is implemented as a conventional 4-20 ma converter, though it will be appreciated that it could be implemented using various other devices. Moreover, it could be eliminated in some embodiments. Nonetheless, in the depicted embodiment, it will be readily appreciated that the sensor output signal 132, like the summation signal, may potentially have four substantially discrete current magnitudes.

The following table (TABLE 1) provides some examples of the voltage and current magnitude values of the summation signal and the sensor output signal 132 for the various states of the proximity sensor 110. In the following table, "ALIVE AND COOL" corresponds to the health status signal 126 being in a logic-HIGH state, "DEAD" corresponds to the health status signal 126 being in a logic-LOW state, "TARGET NEAR" corresponds to the proximity signal 124 being in the logic-LOW state, and "TARGET FAR" corresponds to the proximity signal 124 being in the logic-HIGH state. It will be appreciated that these values are merely exemplary of a particular preferred embodiment, and that these values may vary in other embodiments, as needed or desired.

TABLE 1

|  |  | TARGET NEAR | TARGET FAR |
|---|---|---|---|
| ALIVE AND COOL | SUMMATION SIGNAL (VDC) | 0.5 | 1.4 |
|  | OUTPUT SIGNAL (mA) | 5 | 14 |
| DEAD | SUMMATION SIGNAL (VDC) | 0.0 | 0.9 |
|  | OUTPUT SIGNAL (mA) | 0.0 | 9.0 |

The proximity sensor 100 depicted in FIG. 2 could be implemented without one or more of the depicted and described circuits. For example, the temperature sensor circuit 272 and the health comparator circuit 274 could, in alternative embodiments, be eliminated. In such embodiments, the oscillator health signal is coupled to the summing circuit 286.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A proximity sensor, comprising:
a variable gain oscillator adapted to receive electrical energy, the variable gain oscillator including a sensor coil and having a gain that varies with proximity of a target to the sensor coil, the variable gain oscillator coupled to receive a feedback signal and configured, in response to the feedback signal, to (i) generate an oscillating electrical signal having a substantially constant amplitude magnitude and (ii) generate an energy signal representative of the electrical energy received by the variable gain oscillator;
a temperature sensor circuit configured to sense proximity sensor temperature and supply a temperature signal representative thereof; and
a proximity determination circuit coupled to receive the energy signal and configured, in response thereto, to supply a proximity signal representative of target proximity to the sensor coil, the proximity determination circuit comprising:
a near/far comparator circuit coupled to receive the energy signal and configured, in response thereto, to supply the proximity signal (i) at a logic-LOW state when the target is within a first predetermined distance of the sensor coil and (ii) at a logic-HIGH state at least when the target is not within a second predetermined distance of the sensor coil, and
a fixed resistor circuit coupled between the temperature sensor circuit and the near/far comparator circuit and configured to supply a temperature compensation signal to the near/far comparator circuit.

2. The sensor of claim 1, wherein:
the fixed resistor circuit comprises at least one resistor and a temperature compensation node; and the temperature sensor circuit comprises a temperature sensitive resistive element coupled to the temperature compensation node, to thereby supply the temperature signal to the temperature compensation node.

3. The sensor of claim 2, wherein:
the near/far comparator circuit comprises a voltage divider network that includes at least two resistors connected in series to define a threshold node therebetween; and
the fixed resistor circuit is coupled to the threshold node, to thereby supply the temperature compensation signal to the threshold node.

4. The proximity sensor of claim 1, wherein:
the proximity determination circuit further comprises a low-pass filter circuit coupled to receive the energy signal and supply a filtered energy signal to the near/far comparator circuit; and
and the fixed resistor circuit is further coupled to the low-pass filter circuit.

5. The sensor of claim 1, further comprising:
a feedback circuit coupled to receive the oscillating electrical signal and configured, in response thereto, to supply the feedback signal.

6. The sensor of claim 1, further comprising:
a health monitor circuit coupled to receive the oscillating electrical signal and configured, in response thereto, to supply a health status signal representative of proximity sensor health.

7. The sensor of claim 6, further comprising:
an output circuit coupled to receive the proximity signal and the health status signal and configured, upon receipt thereof, to supply an output signal that is representative of both target proximity to the sensor coil and proximity sensor health.

8. The sensor of claim 6, wherein the feedback circuit comprises:
an amplitude demodulator coupled to receive the oscillating electrical signal and configured, in response thereto, to supply a demodulated voltage signal; and
an integrator circuit coupled to receive the demodulated voltage signal and configured, in response thereto, to supply the feedback signal.

9. The sensor of claim 6, wherein:
the health monitor circuit comprises the temperature sensor circuit; and
the health status signal is further representative of at least relative proximity sensor temperature.

10. The sensor of claim 9, wherein the health monitor circuit further comprises:
a rectifier circuit coupled to receive the oscillating electrical signal and configured, upon receipt thereof, to rectify the oscillating electrical signal and supply a DC signal;
a low-pass filter circuit coupled to receive the DC signal and configured, upon receipt thereof, to supply a filtered DC signal; and
an alive/dead switch circuit coupled to receive the filtered DC signal and configured, upon receipt thereof, to supply an oscillator health signal.

11. The sensor of claim 10, wherein the oscillator health signal is supplied at:
a logic-LOW state if the oscillating electrical signal has an amplitude magnitude less than a predetermined amplitude magnitude; and
a logic-HIGH state if the oscillating electrical signal has an amplitude magnitude that is not less than the predetermined amplitude magnitude.

12. The sensor of claim 11, wherein the health monitor circuit further comprises:
a health comparator circuit coupled to receive the temperature signal from the temperature sensor circuit and the oscillator health signal from the alive/dead switch circuit, the health comparator circuit configured, upon receipt of the temperature signal and the oscillator health signal, to supply the health status signal.

13. The sensor of claim 12, wherein the health status signal is supplied at:
a logic-HIGH state when proximity sensor temperature is less than or equal to a first predetermined temperature and the oscillator health signal is a logic-HIGH state; and
a logic-LOW state when proximity sensor temperature is greater than or equal to a second predetermined temperature or the oscillator health signal is a logic-LOW state.

14. The sensor of claim 6, further comprising:
an output circuit coupled to receive the proximity signal and the health status signal and configured, upon receipt thereof, to supply an output signal that is representative of both target proximity to the sensor coil and proximity sensor health.

15. The sensor of claim 14, wherein the output circuit comprises:
a summing circuit coupled to receive the proximity signal and the health status signal and configured, upon receipt thereof, to supply a summation signal representative of an arithmetic sum thereof; and
a voltage-to-current converter circuit coupled to receive the summation signal and supply the output signal.

16. The proximity sensor of claim 6, wherein the variable gain oscillator comprises a Colpitts oscillator.

17. A proximity sensor, comprising:
a variable gain oscillator adapted to receive electrical energy, the variable gain oscillator including a sensor coil and having a gain that varies with proximity of a target to the sensor coil, the variable gain oscillator coupled to receive a feedback signal and configured, in response to the feedback signal, to (i) generate an oscillating electrical signal having a substantially constant amplitude magnitude and (ii) generate an energy signal representative of the electrical energy received by the variable gain oscillator;
a feedback circuit coupled to receive the oscillating electrical signal and configured, in response thereto, to supply the feedback signal;
a health monitor circuit coupled to receive the oscillating electrical signal and configured, in response thereto, to supply a health status signal representative of proximity sensor health; and
a proximity determination circuit coupled to receive the energy signal and configured, in response thereto, to supply a proximity signal representative of target proximity to the sensor coil, the proximity determination circuit comprising:
a low-pass filter circuit coupled to receive the energy signal and supply a filtered energy signal,
a near/far comparator circuit coupled to receive the filtered energy signal and configured, in response thereto, to supply the proximity signal (i) at a logic-LOW state when the target is within a first predetermined distance of the sensor coil and (ii) at a logic-HIGH state at least when the target is not within a second predetermined distance of the sensor coil, and
a fixed resistor circuit coupled to the near/far comparator circuit and adapted to receive a temperature signal, the fixed resistor network configured, in response to the temperature signal, to supply a temperature compensation signal to the near/far comparator circuit.

18. The sensor of claim 17, wherein:

the fixed resistor circuit comprises at least one resistor and a temperature compensation node; and the proximity sensor further comprises a temperature sensor circuit that comprises a temperature sensitive resistive element coupled to the temperature compensation node, to thereby supply the temperature signal to the temperature compensation node.

19. The sensor of claim 18, wherein:

the near/far comparator circuit comprises a voltage divider network that includes at least two resistors connected in series to define a threshold node therebetween; and the fixed resistor circuit is coupled to the threshold node, to thereby supply the temperature compensation signal to the threshold node.

20. A proximity sensor, comprising:

a variable gain oscillator adapted to receive electrical energy, the variable gain oscillator including a sensor coil and having a gain that varies with proximity of a target to the sensor coil, the variable gain oscillator coupled to receive a feedback signal and configured, in response to the feedback signal, to (i) generate an oscillating electrical signal having a substantially constant amplitude magnitude and (ii) generate an energy signal representative of the electrical energy received by the variable gain oscillator;

a temperature sensor circuit configured to sense proximity sensor temperature and supply a temperature signal representative thereof, the temperature sensor circuit comprising a temperature sensitive resistive element; and a proximity determination circuit coupled to receive the energy signal and configured, in response thereto, to supply a proximity signal representative of target proximity to the sensor coil, the proximity determination circuit comprising:

a low-pass filter circuit coupled to receive the energy signal and supply a filtered energy signal, a near/far comparator circuit coupled to receive the filtered energy signal and configured, in response thereto, to supply the proximity signal (i) at a logic-LOW state when the target is within a first predetermined distance of the sensor coil and (ii) at a logic-HIGH state at least when the target is not within a second predetermined distance of the sensor coil, the near/far comparator circuit comprising a voltage divider network that includes two resistors connected in series to define a threshold node therebetween, and a fixed resistor network coupled between the temperature sensor circuit and the near/far comparator circuit and configured to supply a temperature compensation signal to the near/far comparator circuit, the fixed resistor network comprising at least one resistor and a temperature compensation node, the temperature compensation node coupled to the temperature sensitive resistive element and the threshold node.

* * * * *